(12) United States Patent
Sebastian et al.

(10) Patent No.: US 10,417,942 B2
(45) Date of Patent: Sep. 17, 2019

(54) PRODUCT AND PACKAGE INCLUDING POWER PRODUCER AND OUTPUT MECHANISM, AND RELATED METHOD

(71) Applicant: R.J. Reynolds Tobacco Company, Winston-Salem, NC (US)

(72) Inventors: Andries Don Sebastian, Clemmons, NC (US); Rajesh Sur, Winston-Salem, NC (US); Friedrich Karl Eibensteiner, Linz (AT)

(73) Assignee: R.J. Reynolds Tobacco Company, Winston-Salem, NC (US)

( * ) Notice: Subject to any disclaimer, the term of this patent is extended or adjusted under 35 U.S.C. 154(b) by 0 days.

(21) Appl. No.: 15/834,767

(22) Filed: Dec. 7, 2017

(65) Prior Publication Data

US 2019/0180659 A1    Jun. 13, 2019

(51) Int. Cl.
    *G09F 23/04* (2006.01)
    *G09F 27/00* (2006.01)
    *G09F 13/22* (2006.01)
    *H03K 17/94* (2006.01)
    *G02F 1/00* (2006.01)

(52) U.S. Cl.
    CPC .......... *G09F 23/04* (2013.01); *G02F 1/0072* (2013.01); *G09F 13/22* (2013.01); *G09F 27/007* (2013.01); *H03K 17/94* (2013.01)

(58) Field of Classification Search
    None
    See application file for complete search history.

(56) References Cited

U.S. PATENT DOCUMENTS

| 4,202,607 | A | * | 5/1980 | Washizuka ........ G02F 1/133308 |
| | | | | 349/113 |
| 4,615,681 | A | | 10/1986 | Schwarz |
| 6,698,085 | B2 | | 3/2004 | Stevenson et al. |
| 6,825,829 | B1 | * | 11/2004 | Albert .................... B41J 3/4076 |
| | | | | 345/107 |
| 6,896,145 | B2 | | 5/2005 | Higgins et al. |
| 7,119,804 | B2 | | 10/2006 | Sweeney et al. |
| 7,356,952 | B2 | | 4/2008 | Sweeney et al. |
| 7,429,984 | B2 | | 9/2008 | Sweeney |
| 7,617,930 | B2 | | 11/2009 | Jones et al. |
| 7,624,918 | B2 | | 12/2009 | Sweeney et al. |
| 8,118,161 | B2 | | 2/2012 | Guerrera et al. |
| 2007/0165366 | A1 | | 7/2007 | Sokola |
| 2009/0008275 | A1 | | 1/2009 | Ferrari et al. |

(Continued)

FOREIGN PATENT DOCUMENTS

| CN | 201914605 | 8/2011 |
| DE | 29800440 | 3/1998 |

(Continued)

*Primary Examiner* — Ashok Patel
(74) *Attorney, Agent, or Firm* — Womble Bond Dickinson (US) LLP

(57) ABSTRACT

A promotional product including an emitter is provided. One or more tobacco-containing articles may be received in the package. The promotional product may include an actuator for facilitating delivery of power from a power source to the emitter to provide a visual, audio, and/or haptic effect to the promotional product. The emitter specifically can be a visual emitter, such as an electroluminescent emitter. A related method is also provided.

9 Claims, 6 Drawing Sheets

(56) References Cited

U.S. PATENT DOCUMENTS

| 2009/0261114 | A1 | 10/2009 | McGuire et al. |
| 2009/0284164 | A1 | 11/2009 | Ray et al. |
| 2013/0334293 | A1 | 12/2013 | Coatney et al. |
| 2015/0294398 | A1 | 10/2015 | Khalid et al. |
| 2017/0027220 | A1 | 2/2017 | Sebastian et al. |

FOREIGN PATENT DOCUMENTS

| DE | 20012927 | 3/2001 |
| WO | WO 2015/022336 | 2/2015 |
| WO | WO 2017/178995 | 10/2017 |

* cited by examiner

PRODUCT AND PACKAGE INCLUDING POWER PRODUCER AND OUTPUT MECHANISM, AND RELATED METHOD

FIELD OF THE DISCLOSURE

The present disclosure relates to promotional products including emitters, and a related method. The products, packages, and methods may be employed in conjunction with articles made or derived from tobacco, or that otherwise incorporate tobacco.

BACKGROUND OF THE DISCLOSURE

In the marketing industry, products may be provided with certain features designed and configured to capture a consumer's attention. For example, promotional literature may include eye-catching images, graphics, or fonts. Thereby, a recipient of the promotional product may be more likely to review the promotional product in detail.

Because of the benefits of such attention-catching designs, an increasing number of products are modified to include such pleasing aesthetic attributes, and this leads to increasing competition to gain a consumer's attention, which in turn results in a lessening of the competitive advantages of the designs. Accordingly, it may be desirable to provide promotional products with even greater enhanced functionality in order to further appeal to a consumer's interest.

BRIEF SUMMARY OF THE DISCLOSURE

The present disclosure provides articles that include at least one switchable element that is configured for providing a visual, audible, or haptic effect that can be perceived by a consumer. In some embodiment, the switchable element comprises a visual effect and can include at least one component that is at least partially electroluminescent. Alternatively or additionally, the switchable element may provide an audio effect (e.g., sounds and/or words) and/or a haptic effect (e.g., vibration or a series of vibrations). The articles particularly may be configured to provide information in for the form of words and/or graphics, and at least a portion of the words and/or graphics may be adapted to emit light from an electroluminescent emitter included with the article. As such, the articles can be configured to output a perceptible effect such that attention may be drawn article and, particularly, to any portion of the article emitting light via the electroluminescent emitter. The article may be solely informative. Alternatively, the article may be, for example, a package and thus be configured for containing a product. For example, the product may include one or more tobacco-containing materials. In some embodiments, the articles may be promotional products in that the information provided thereby can be effective for drawing attention to the article and thus increase sales of an associated product. A promotional product thus may be solely informative in nature or may also be configured as a package.

In one or more embodiments, a promotional product according to the present disclosure can comprise: a substrate defining a front primary surface and a rear primary surface; an emitter associated with the substrate, the emitter being configured to provide at least one of a visual, audio, or haptic effect; an electrical power source at the rear primary surface; a plurality of connectors extending through the substrate and into engagement with the electrical power source and the emitter; and an actuator including a moveable member, a bridging contact engaged with the moveable member, a first stationary contact, and a second stationary contact, wherein the first stationary contact and the second stationary contact are not in an electrically conducting engagement, the moveable member being configured to move to selectively electrically engage the bridging contact with the first stationary contact and the second stationary contact to form an electrical connection between the first stationary contact and the second stationary contact and thus direct an electrical current from the electrical power source to the emitter to output the at least one of a visual, audio, or haptic effect.

In further embodiments, the promotional product may be defined in relation to any one or more of the following statements, which may be combined in any number and order.

The emitter can be an electroluminescent emitter that can be printed on the front primary surface of the substrate.

The moveable member can be connected to a user-actuable switch.

The substrate can be configurable between an unfolded configuration and a folded configuration in which the rear primary surface defines a first outer portion and a second outer portion, the moveable member extending from the first outer portion to the second outer portion.

The substrate can be configured such that when the substrate is in the folded configuration the bridging contact is not in electrical connection with both of the first stationary contact and the second stationary contact, and when the substrate is in the unfolded configuration the bridging contact is in electrical connection with both of the first stationary contact and the second stationary contact.

One or more of the bridging contact, the first stationary contact, and the second stationary contact can be printed.

The promotional product can further comprise a resin at least partially covering the connectors at the rear primary surface.

The promotional product can further comprise a rear cover layer engaged with the rear primary surface.

The substrate can comprise a paperboard substrate.

The promotional product can further comprise a regulating circuit engaged with the rear primary surface, and the regulating circuit can be configured to regulate a flow of the electrical current to the emitter.

In one or more embodiments, the present disclosure can relate to a promotional product assembly method. For example, such assembly method can comprise: providing a substrate defining a front primary surface and a rear primary surface; coupling an emitter to the substrate; the emitter being configured to provide at least one of a visual, audio, or haptic effect; coupling an electrical power source to the rear primary surface; inserting a plurality of connectors into engagement with the electrical power source and the emitter; and engaging an actuator with one or more of the connectors, the actuator including a moveable member, a bridging contact engaged with the moveable member, a first stationary contact, and a second stationary contact, wherein the first stationary contact and the second stationary contact are not in an electrically conducting engagement, the moveable member being configured to move to selectively electrically engage the bridging contact with the first stationary contact and the second stationary contact to form an electrical connection between the first stationary contact and the second stationary contact and thus direct an electrical current from the electrical power source to the emitter to output the at least one of a visual, audio, or haptic effect.

In further embodiments, the promotional product assembly method can be defined by one or more of the following statements, which can be combined in any number and order.

Coupling the emitter to the substrate can comprise printing an electroluminescent emitter on a front primary surface of the substrate.

The method can further comprise connecting a user-actuable switch to the moveable member.

The method can further comprise folding the substrate from an unfolded configuration to a folded configuration in which the rear primary surface defines a first outer portion and a second outer portion, the moveable member extending from the first outer portion to the second outer portion.

The promotional product assembly method can be configured such that when the substrate is in the folded configuration the bridging contact is not in electrical connection with both of the first stationary contact and the second stationary contact, and when the substrate is in the unfolded configuration the bridging contact is in electrical connection with both of the first stationary contact and the second stationary contact.

The method can further comprise printing one or more of the bridging contact, the first stationary contact, and the second stationary contact.

The method can further comprise at least partially covering the connectors with a resin.

The method can further comprise engaging a rear cover layer with the rear primary surface.

Providing the substrate can comprise providing a paperboard substrate.

The method can further comprise engaging a regulating circuit with the rear primary surface, the regulating circuit being configured to regulate a flow of the electrical current to the emitter.

BRIEF DESCRIPTION OF THE DRAWINGS

Figure 1:
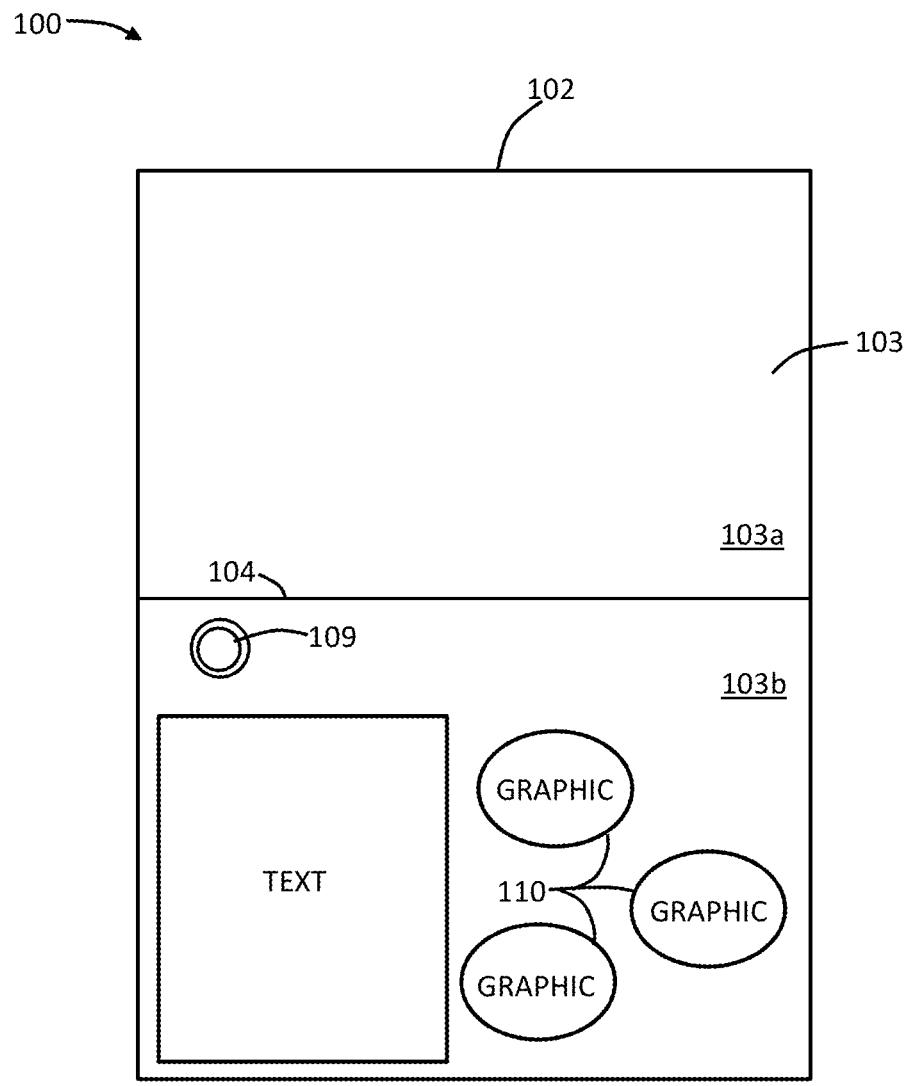
Figure 2:
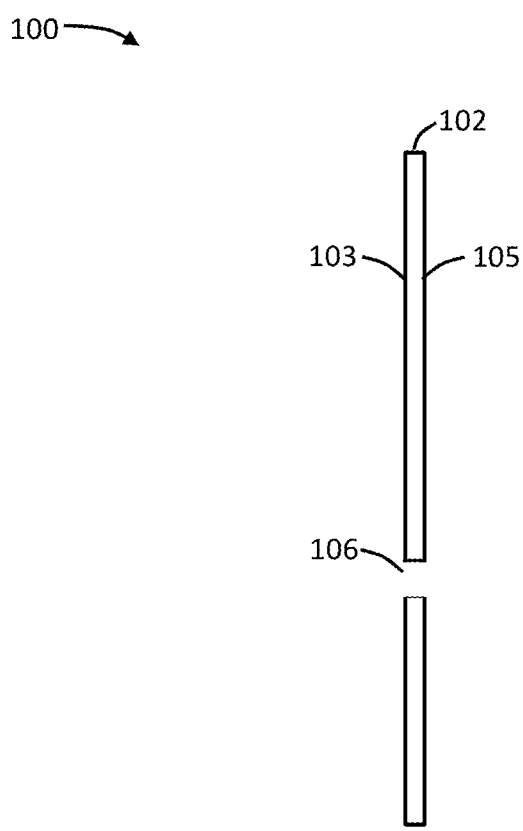
Figure 3:
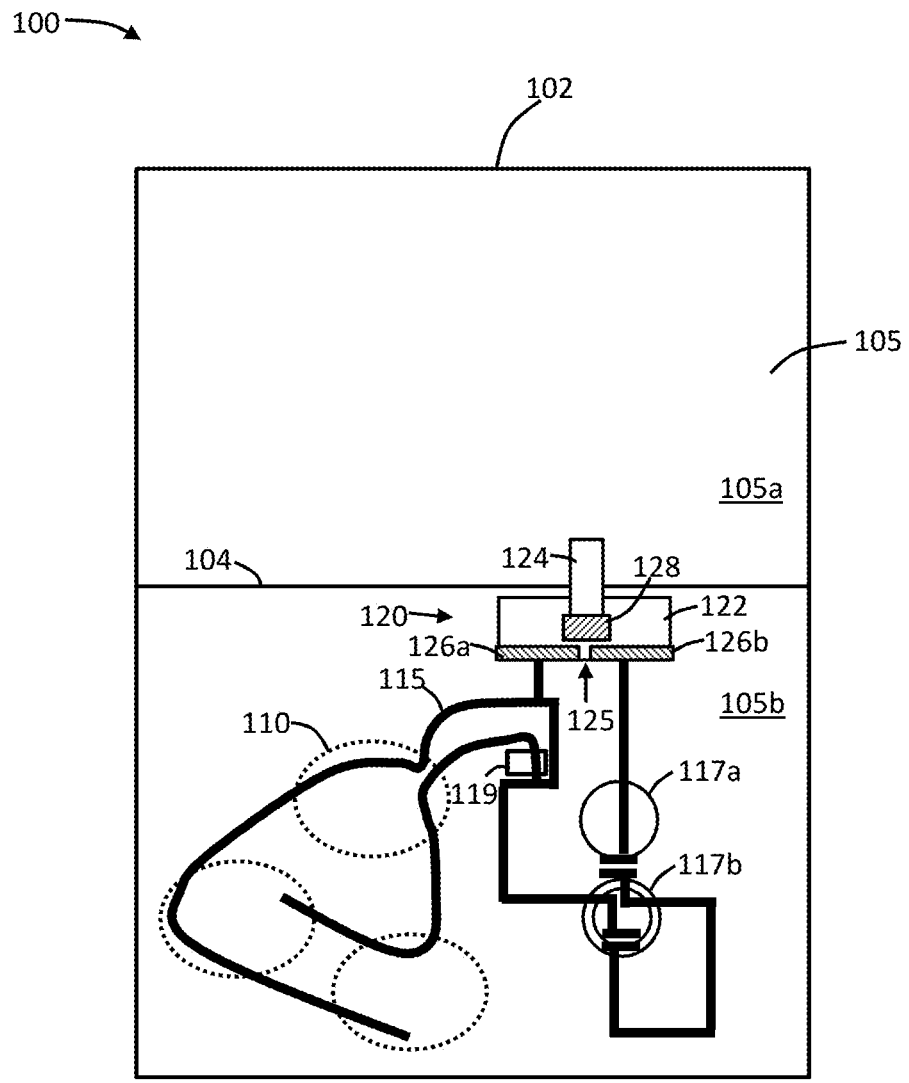
Figure 4:
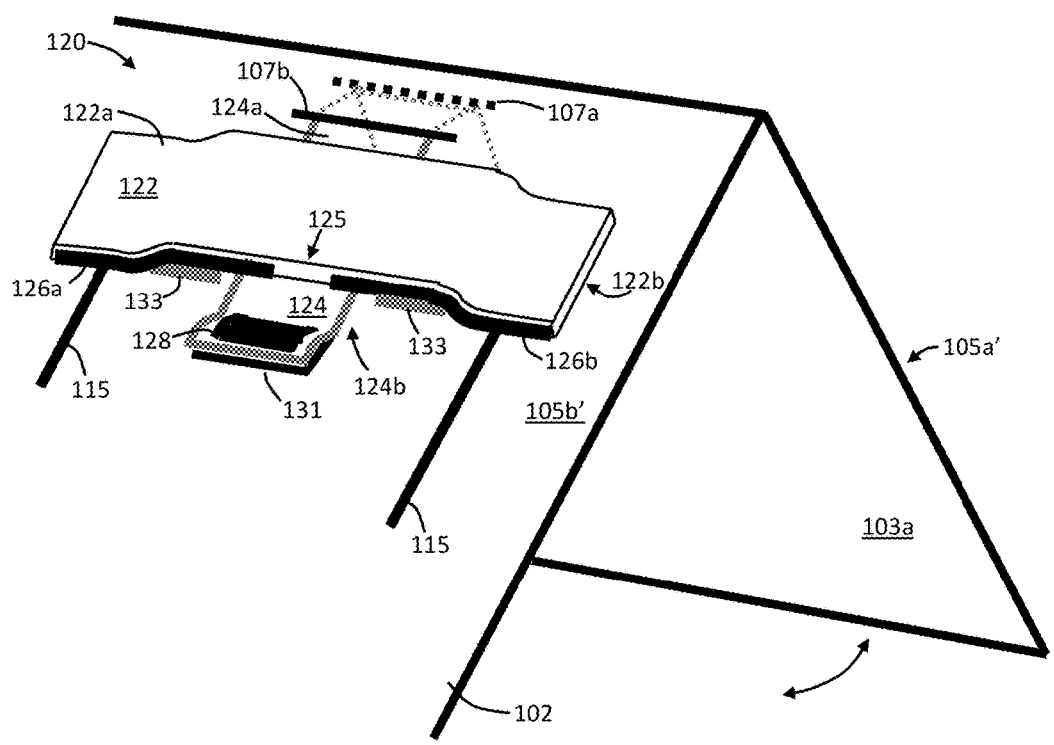
Figure 5:
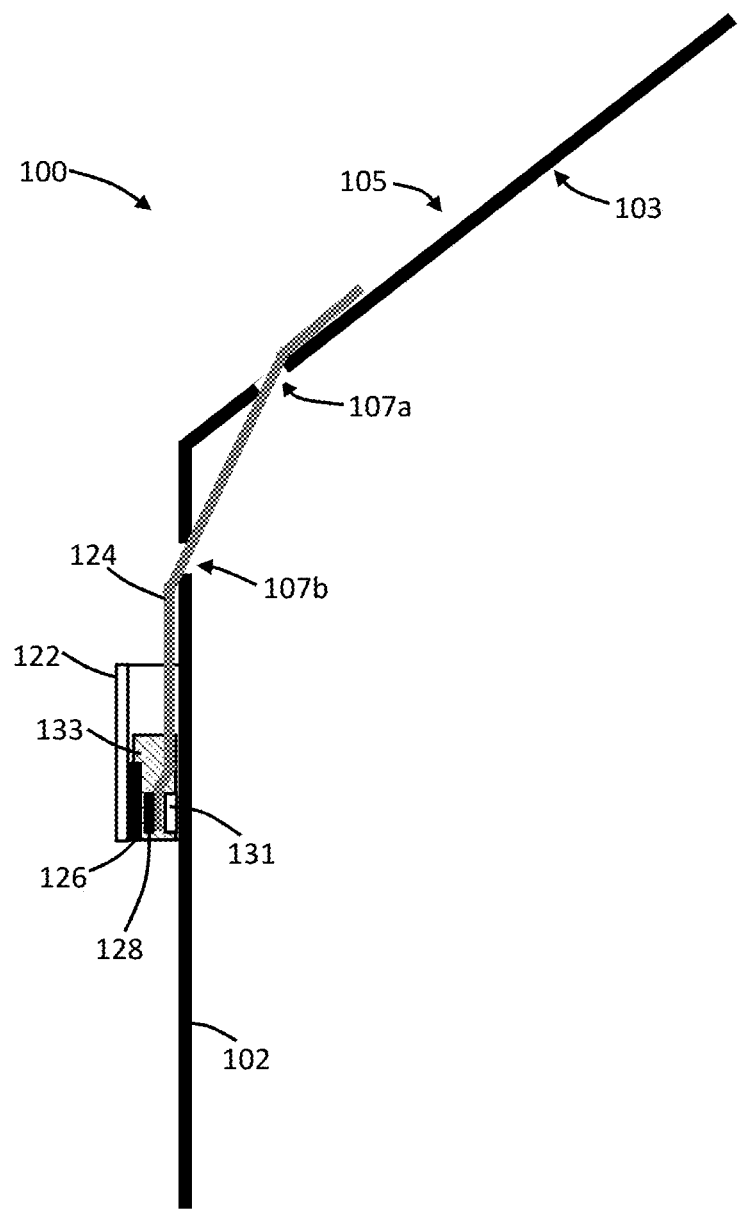
Figure 6:
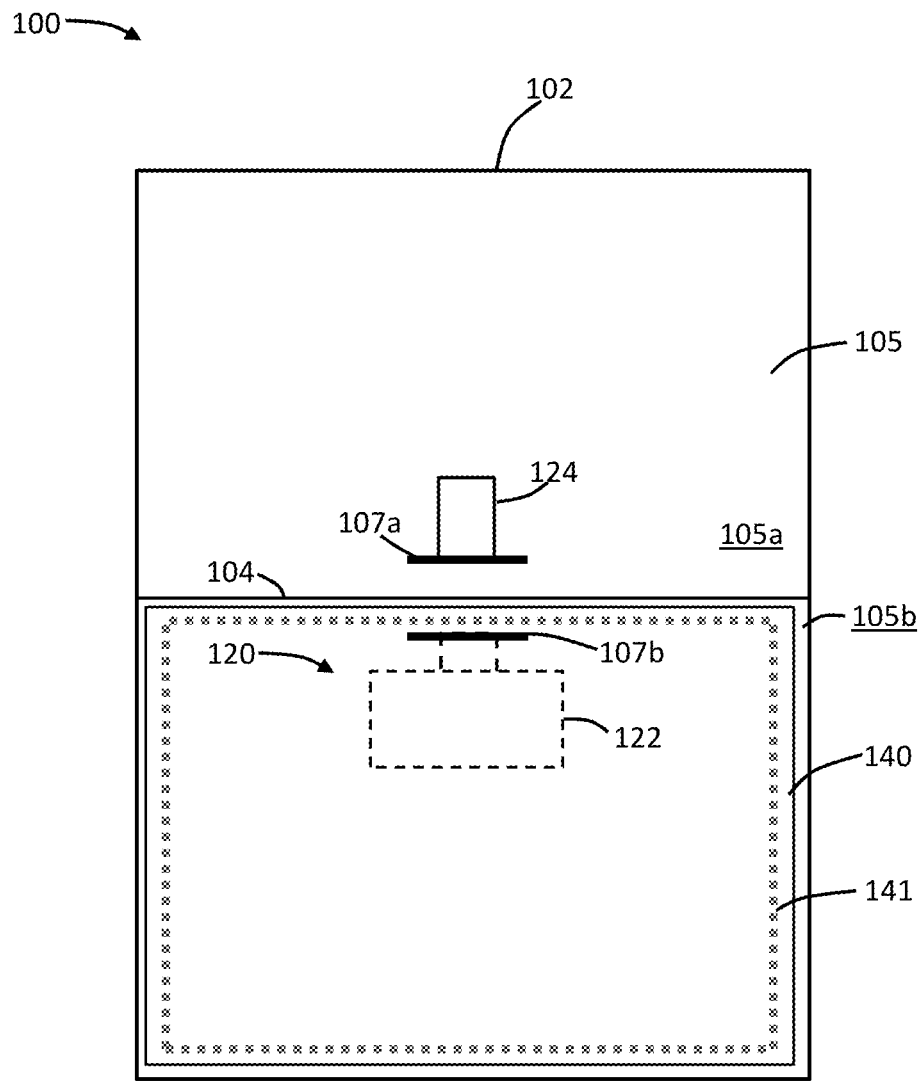

Having thus described the disclosure in general terms, reference will now be made to the accompanying drawings, which are not necessarily drawn to scale, and wherein:

FIG. 1 shows a plan view of one side of a promotional product according to embodiments of the present disclosure;

FIG. 2 shows a partial cross-section of a substrate for a promotional product according to embodiments of the present disclosure;

FIG. 3 shows a plan view of an opposing side of the promotional product illustrated in FIG. 1;

FIG. 4 shows a partial perspective view of a promotional product according to embodiments of the present disclosure, a substrate of the promotional product being in a partially folded configuration;

FIG. 5 shows a partial cross-section of a promotional product according to embodiments of the present disclosure, the substrate of the promotional product being partially unfolded relative to the configuration illustrated in FIG. 4; and FIG. 6 is a plan view of one side of a promotional product according to embodiments of the present disclosure including a cover layer.

DETAILED DESCRIPTION OF THE DISCLOSURE

The present disclosure now will be described more fully hereinafter with reference to certain preferred aspects. These aspects are provided so that this disclosure will be thorough and complete, and will fully convey the scope of the disclosure to those skilled in the art. Indeed, the disclosure may be embodied in many different forms and should not be construed as limited to the aspects set forth herein; rather, these aspects are provided so that this disclosure will satisfy applicable legal requirements. As used in the specification, and in the appended claims, the singular forms "a", "an", "the", include plural referents unless the context clearly dictates otherwise.

Promotional products embodied in tangible media may be made available to consumers and potential consumers of products in a variety of manners. One example embodiment of a promotional product frequently employed is promotional literature. By way of example, pamphlets, cards, letters, or the like may be distributed as a method of bringing attention to a specific brand or consumer product. In light of the ubiquitousness of digital media, it can be challenging to obtain a desired attention to printed media. In order to improve consumer viewing of a promotion product or other type of tangible, printed media, it can be beneficial to provide various effects that draw attention to the product. Non-limiting examples include visual effects, audio effects, and haptic effects. In some embodiments, it can be beneficial to provide a product that is substantially entirely lighted. In some embodiments, substantially all of the text on the product may be lighted. In some embodiments, only a portion of the text on the product may be lighted. In some embodiments, only specific words on the product may be lighted. In some embodiments, words and graphics on the product may be lighted. In some embodiments, substantially all of the graphics on the product may be lighted. In some embodiments, only specific graphics on the product may be lighted.

The promotional products particularly can be configured with a switching element so that the desired effect can be turned on manually or automatically. Specifically, handling of the promotional products by a user can be effective to activate the switching element so that the desired effect is provided.

A visual effect can include lighting by any source, particularly electroluminescence, as otherwise described herein. The visual effect otherwise may include other elements, such as visual motion of a portion of the product. An audio effect can include formation of sounds, recorded speech, digitally synthesized speech, and the like. In some embodiments, the audio component can comprise a transducer, which can be provided on an integrated circuit (e.g., with a microcontroller). An audio chip may be provided, which chip can include or can be in electrical connection with a speaker or buzzer, and which chip can include a memory driver, integrated RAM or ROM, and the like. A haptic effect can be provided utilizing any component that is adapted to apply forces, vibrations, or motions to a user holding the product. Vibrating motors and the like may be utilized, and materials such as those disclosed in U.S. Patent Pub. No. 2015/0020825, which is incorporated herein by reference, may be used.

In this regard, FIG. 1 schematically illustrates a promotional product 100 according to an example embodiment of the present disclosure. The promotional product 100 may include a substrate 102, which can take on a variety of shapes and sizes. The substrate 102 may be defined herein as comprising a front primary surface 103, which front primary surface 103 may be divided into a first front portion 103a and a second front portion 103b. As further described herein, the different portions may be relevant to how the product is viewed after folding of the product, such as along a fold line (line 104 in FIG. 1). As further illustrated in FIG. 2, the substrate 102 may define a rear primary surface 105 opposing the front primary surface 103, and at least one aperture 106 may be defined in the substrate. Such aperture 106 can be provided for passage therethrough of connectors, such as electrical conductors, actuation elements, or the like. As illustrated in FIG. 2, the substrate 102 can be significantly thinner in dimension relative to the height and/or width of the substrate. As seen in FIG. 1, the substrate 102 includes an area dedicated for text (e.g., printed, embossed, or otherwise applied) and areas for graphics.

The substrate 102 can be formed of any suitable material. In one example embodiment the substrate may comprise cardboard or paperboard. Usage of cardboard or paperboard may provide the substrate with rigidity, which may support the various other components of the promotional product 100 and optionally allow for folding in a controlled manner as discussed herein. However, in other embodiments the substrate 102 may additionally or alternatively comprise other materials, such as plastics, metals, and any material that is generally suitable for formation of promotional products as described herein.

The promotional product 100 further may include an emitter 110. In FIG. 1, three emitters 110 are shown; however, it is understood that more or fewer emitters may be utilized. As illustrated by the presence of the descriptor "GRAPHIC," the graphic elements of the promotional product 100 are configured as the emitter 110. As such, the emitters 110 can particularly be a visual emitter, such as an electroluminescent emitter. In other embodiments, all or a portion of the text may be configured as an electroluminescent emitter alone or in combination with the graphics being configured as an electroluminescent emitter. The emitter 110 may be positioned in contact with the front primary surface 103 of the substrate 102. The emitter 110 may be configured to output light as otherwise described herein. Alternatively, the emitter 110 may be positioned in contact with the rear primary surface 105 of the substrate 102. In such embodiments, the emitter 110 may particularly be an audio emitter or a haptic emitter such that the effect to be emitted need not necessarily be visually accessible to a user.

In embodiments utilizing an electroluminescent emitter, said electroluminescent emitter may be formed in any manner otherwise recognized as useful for forming electroluminescent materials. In particular, an electroluminescent emitter can comprise an electroluminescent ink or paint or a plurality of different electroluminescent inks or paints (the terms "ink" and "paint" being interchangeable in this sense). It is understood that an electroluminescent ink can encompass any material that includes an electroluminescent phosphor and is capable of being coated or otherwise applied to a substrate. As non-limiting examples, electroluminescent phosphors can include a variety of zinc sulfide materials optionally doped with other materials, such as copper, silver, and manganese. Electroluminescent inks are available commercially, such as the line of materials available from DuPont under the LuxPrint® name and paints by LitCoat™, a division of Lyttron LLC.

The use of electroluminescent inks in forming an electroluminescent emitter can be particularly beneficial for ease of manufacturing and for providing flexibility in the type of light emitting element that will be utilized in a particular promotional product. In some embodiments, an electroluminescent emitter can be a pre-formed unit that can be attached to the substrate. For example, an electroluminescent emitter can be prepared as a multi-layer construct comprising a front electrode, a back electrode, a phosphor between the electrodes, and a dielectric separating the phosphor from one of the electrodes. In some embodiments, the electroluminescent emitter can be constructed directly on the substrate by application of the necessary layers. As a non-limiting example, an electroluminescent emitter can comprise the following materials in succession: a back electrode, such as a silver ink coating; a dielectric layer, such as a dielectric ink; a phosphor layer, such as a phosphor ink; and a transparent layer effective as a front electrode, such as indium tin oxide coated on a transparent substrate. An outer bus bar can also be present for efficient transfer of electrical energy to activate the electroluminescent emitter. The bus bar may, for example, be printed from the same material as the back electrode. If desired, various other embodiments of light emitting elements may be utilized with the promotional product in addition to the electroluminescent emitter or instead of the electroluminescent emitter. For example, any of an electronic ink, a light emitting electrochemical cell (LEC), an electrochromic display, and/or a light emitting diode (LED) may be used.

The promotional product 100 further can include an electrical power source in electrical connection with the emitter 110. The electrical power source in particular can be positioned at the rear primary surface 105 of the substrate 102. FIG. 3 illustrates a plan view of the rear primary surface 105 of the substrate 102 from FIG. 1. The rear primary surface 105 of the substrate 102 may be divided into a first rear portion 105a and a second rear portion 105b. As further described herein, the different portions may be relevant to how the product is viewed after folding of the product, such as along a fold line (line 104 in FIG. 3). A pair of batteries (117a, 117b) is illustrated as the electrical power source; however, it is understood that more or fewer batteries or a different power source may be utilized. Electrical connectors 115 are shown interconnecting the batteries (117a, 117b) with the emitters 110 (illustrated in dashed lines to indicate their presence on the opposing, front primary surface 103 of the substrate 102). A plurality of connectors 115 are shown, and they extend through the substrate 102 (e.g., through at least one aperture 106—see FIG. 2) and into engagement with the electrical power source—i.e., the batteries (117a, 117b), and the emitters 110. In some embodiments, a regulating circuit 119 may be present and may be engaged with the rear primary surface 105. The regulating circuit 119 being configured to regulate a flow of the electrical current from the batteries (117a, 117b) to the emitters 110. The regulating circuit 119 may be included on a printed circuit board (PCB). Further, all or a part of the connectors 115 may be covered with a coating material to protect the connectors and/or to secure the connectors to the substrate 102. The coating material may be an adhesive, such as an epoxy or resin. For example, a conductive epoxy may be applied to all or a part of the connectors 115. In particular, a coating/adhesive may be applied at the point or points where the connectors 115 pass through the substrate 102 to make electrical connection with the emitters 110. Conductive epoxies may be used for making multiple electrical connections in the present product—e.g., between connectors and the power source and/or between connectors and the emitters.

The connectors 115 may be, for example, wires that are secured to the substrate 102. In some embodiments, the connectors 115 can be printed directly onto the substrate 102 and optionally coated with a coating as noted above. Conductive epoxy, for example, can be used to form an electrical connection between printed connectors 115 and electrical contacts extending from the emitters 110 through the substrate 102.

A promotional product further can include an actuator 120 that is configured to direct an electrical current from the electrical power source (i.e., batteries 117a and 117b) to the emitters 110 to provide power for the output of the effect, such as output of a light at the front primary surface 103 of the substrate 102. The actuator 120 can include a stationary member 122 and a moveable member 124, which moveable member can have a bridging contact 128 engaged therewith. The actuator 120 further can include a first stationary contact 126a and a second stationary contact 126b (collectively referred to as stationary contacts 126), which stationary contacts can be in electrical connection with the plurality of connectors 115. In one or more embodiments, any or all of the bridging contact 128 and the stationary contact) 126 can be printed contacts. As seen in FIG. 3, the stationary contacts 126 are separated by a gap 125 that causes the circuit formed by the batteries (117a, 117b), the emitters 110, and the connectors 115 to be open and thus prevent flow of electrical current from the batteries to the emitters. Because of the spatial separation, the first stationary contact 126a and the second stationary contact 126b are not in an electrically conducting relationship. In other words, electrical conduction does not proceed between the first stationary contact 126a and the second stationary contact 126b without the presence of an intervening member. While this is illustrated as being achieved with spatial separation, it is understood that other means of preventing electrical conduction between the stationary contacts 126 can be used, such as providing a physical insulator between the stationary contacts. The moveable member 124 is thus configured to move so as to selectively, electrically engage the bridging contact 128 with the stationary contacts 126 to close the electrical circuit and direct the flow of electrical current batteries (117a, 117b) to the emitters 110. As such, when the bridging contact 128 is moved into electrical connection with the stationary contacts 126, an electrically conducting relationship is temporarily created between the first stationary contact 126a and the second stationary contact 126b.

The stationary member 122 and the moveable member 124 can be prepared from a variety of materials, including paper, cardboard, films (e.g., natural or synthetic materials), textiles, and the like. The stationary member 122 preferably provides sufficient rigidity to bias an electrical connection between the stationary contacts 126 and the bridging contact 128 when the bridging contact 128 is aligned with the stationary contacts. The stationary member 122 also may exhibit a certain degree of flexibility. The moveable member preferably exhibits sufficient tensile strength to cause the bridging contact 128 to slide into and out of electrical connection with the stationary contacts 126 due to a pulling force on an end of the moveable member opposing the end of the moveable member including the bridging contact.

The actuator 120 can take on a variety of configurations. In one or more embodiments, the moveable member 124 can comprise a user-actuable switch. The moveable member 124 may itself form the user-actuable switch, or the moveable member may be connected with the user-actuable switch such that actuation of the switch causes movement of the moveable member. The user-actuable switch may be a depressable member, may be an extendable member, or may be any other type of switching member. A button 109 is shown positioned on the front primary surface 103 such that a user may depress the button to activate the emitters 110. The bridging contact 128 may engage the stationary contacts 126 only so long as the user-actuable switch is actuated (e.g., so long as the button 109 is depressed). Alternatively, the user-actuable switch may be a re-setting switch such that actuation of the switch causes the bridging contact 128 to engage the stationary contacts 126 until the switch is actuated a second time to release the contact or until an automated release mechanism re-sets the switch and thus disengages the bridging contact from the stationary contacts.

In some embodiments, the actuator 120 can be configured for automated actuation. In particular, the substrate 102 can be foldable, and the action of folding or unfolding the substrate may automatically cause the bridging contact 128 to make electrical connection with the stationary contacts 126. Such embodiments are illustrated in relation to FIG. 4 and FIG. 5.

As seen in FIG. 4 and FIG. 5, the substrate 102 is configurable between an unfolded configuration and a folded configuration. When folded, the rear primary surface 105 of the substrate 102 can define a first outer portion 105a' (corresponding to the first portion 105a of the rear primary surface) and a second outer portion 105b' (corresponding to the second portion 105b of the rear primary surface). The moveable member 124 of the actuator 120 extends from the first outer portion 105a' to the second outer portion 105b' passing through a first slot 107a and a second slot 107b formed in the substrate 102.

As in the embodiments described above, the actuator 120 comprises a stationary member 122 and a moveable member 124. The stationary member 122 is attached to the substrate 102, and a portion of the stationary member is spaced apart from the substrate 122. In particular, adhesive strips 133 can function to attach the stationary member 122 to the substrate 102 and simultaneously space the stationary member apart from the substrate. Said spacing provides room for the moveable member 124 to slide underneath the stationary member 122. In particular, the stationary member 122 includes a top surface 122a and a bottom surface 122b, and the stationary contacts 126 are positioned at the bottom surface of the stationary member. In such position, the stationary contacts 126 are in electrical connection with the connectors 115. Again, a gap 125 separates the stationary contacts 126 so that the electrical circuit is completed when the bridging contact 128 positioned on a top surface 124a of the moveable member 124 is moved into alignment with the stationary contacts. A spacer 131 is positioned below the moveable member 124 proximate to the bridging contact 128 (preferably directly below the bridging contact) to bias the bridging contact against the stationary contacts 126 when the bridging contact is moved underneath the stationary contacts. In some embodiments, the substrate 102 is in the folded configuration, the bridging contact 128 is not in electrical connection with the stationary contacts 126. When the substrate 102 is in an unfolded configuration, however, the bridging contact 128 is in electrical connection with the stationary contacts 126.

As seen in FIG. 5, when the substrate 102 is a sufficiently unfolded position, the portion of the moveable member 124 including the bridging contact 128 on the top surface 124a thereof is moved into electrical connection with the stationary contacts 126 at the bottom surface 122b of the stationary member 122. This is due to the sliding action of the moveable member 124, a portion of which is adhered or otherwise secured to the rear primary surface 105 of the substrate 102. In particular, a portion of the moveable member 124 extends through the first slot 107a and the second slot 107b formed in the substrate 102 such that an intermediate portion of the moveable member is positioned adjacent the front primary surface 103 while end portions of the moveable member are positioned adjacent the rear primary surface. As the substrate 102 is folded, the end of the moveable member 124 including the bridging contact 126 slides out of electrical connection with the stationary contacts 126.

In other embodiments, the positions of the contacts may be altered. For example, the stationary contacts 126 may be positioned on the rear primary surface 105 of the substrate 102 instead of being positioned at the bottom surface 122*b* of the stationary member 122. The positioning of the bridging contact 128 on the moveable member 124 may be changed so that the bridging contact is positioned on the bottom surface 124*b* of the moveable member. The spacer 131 may be positioned on the top surface 124*a* of the moveable member 124 if desired to facilitate physical engagement of the bridging contact 128 with the stationary contacts 126 when the moveable member slides under the stationary member 122. The stationary member 122 thus can provide the function of being a biasing member. In other embodiments, the spacer 131 can be positioned on the bottom surface 124*b* of the moveable member 124, and the bridging contact 128 can be positioned on the spacer.

In one or more embodiments, a rear cover layer 140 may be included to at least partially cover the functional components of the promotional product 100. As illustrated in FIG. 6, a rear cover layer 140 is engaged with the rear primary surface 105, particularly, particularly the second rear portion 105*b* thereof. As seen in dashed lines, the rear cover layer 140 covers the actuator 120, including the stationary member 122 and a portion of the moveable member 124. The remainder of the moveable member 124 extending through the first slot 107*a* is visible; however, if desired, the rear cover layer 140 may be sufficiently sized to also cover this portion of the substrate 102. Alternatively, a second rear cover layer may be added. The rear cover layer 140 may be adhered to the substrate 102 in a manner that does not inhibit necessary movements of the elements of the actuator 120. For example, glue 141 (or other adhesive element) may be used at least partially around a periphery of the rear cover layer 140 between the rear cover layer and the substrate 102.

In one or more embodiments, the present disclosure can relate to promotional product assembly methods. For example, such method can comprise providing a substrate 102 defining a front primary surface 103 and a rear primary surface 105; coupling an emitter 110 to the front primary surface; coupling an electrical power source (e.g., batteries 117*a* and 117*b*) to the rear primary surface; inserting a plurality of connectors 115 through the substrate and into engagement with the electrical power source and the emitter; and engaging an actuator 120 with one or more of the connectors, the actuator including a moveable member 124, a bridging contact 128 engaged with the moveable member, a first stationary contact 126*a*, and a second stationary contact 126*b*, the moveable member being configured to move to selectively engage the bridging contact with the stationary contacts to direct an electrical current from the electrical power source to the emitter to output a perceptible effect, such as a light at the front primary surface.

While it can be preferred to utilize an electroluminescent emitter as a visual emitter in the present products, other types of visual emitters may also or alternatively be utilized. Non-limiting examples of further light emitters that may be used include a light emitting diode, a liquid crystal display, electronic or photonic ink, a light emitting electrochemical cell (LEC), and an electrochromic display. Likewise, any one or more of the light emitters noted herein may expressly be excluded from use.

Various embodiments of the power supply may be employed to supply power to the emitter. In one embodiment the power supply may comprise a battery. The battery may be replaceable, rechargeable, or configured to last a lifetime of the product. In one or more embodiments, the power supply may comprise a power producer. A power producer, as used herein, refers to an embodiment of the power supply 120 configured to produce, as opposed to store or transmit, an electrical current. Thus, batteries, capacitors, and other current storage mechanisms are not by themselves considered to be power producers within the meaning of a power producer as this term is used herein. Note, however, that in some embodiments the control circuit may include a battery, a capacitor, or other current storage mechanism in combination with a power producer. Thereby, the current stored by the battery, capacitor, or other current storage mechanism may be selectively outputted to the output mechanism when desired. A power producer may encompass, for example, any of the following: energy harvesting elements configured to receive and convert ambient energy (e.g., electric or magnetic fields or radio waves from nearby electrical equipment, light, thermal energy, or kinetic energy such as vibration or motion into electrical current); and light-to-power conversion mechanisms (e.g., photovoltaic cells).

Many modifications and other aspects of the disclosure set forth herein will come to mind to one skilled in the art to which the disclosure pertains having the benefit of the teachings presented in the foregoing descriptions and the associated drawings. Therefore, it is to be understood that the disclosure is not to be limited to the specific aspects disclosed and that modifications and other aspects are intended to be included within the scope of the appended claims. Although specific terms are employed herein, they are used in a generic and descriptive sense only and not for purposes of limitation.

That which is claimed:

1. A promotional product, comprising:
   a substrate defining a front primary surface and a rear primary surface;
   an emitter associated with the substrate, the emitter being configured to provide at least one of a visual, audio, or haptic effect;
   an electrical power source at the rear primary surface;
   a plurality of connectors extending through the substrate and into engagement with the electrical power source and the emitter; and
   an actuator including a moveable member, a bridging contact engaged with the moveable member, a first stationary contact, and a second stationary contact, wherein the first stationary contact and the second stationary contact are not in an electrically conducting engagement,
   the moveable member being configured to move to selectively electrically engage the bridging contact with the first stationary contact and the second stationary contact to form an electrical connection between the first stationary contact and the second stationary contact and thus direct an electrical current from the electrical power source to the emitter to output the at least one of a visual, audio, or haptic effect.

2. The promotional product of claim 1, wherein the emitter is an electroluminescent emitter that is printed on the front primary surface of the substrate.

3. The promotional product of claim 1, wherein the moveable member is connected to a user-actuable switch.

4. The promotional product of claim 1, wherein the substrate is configurable between an unfolded configuration and a folded configuration in which the rear primary surface defines a first outer portion and a second outer portion, the moveable member extending from the first outer portion to the second outer portion.

5. The promotional product of claim 4, wherein when the substrate is in the folded configuration the bridging contact is not in electrical connection with both of the first stationary contact and the second stationary contact, and
   when the substrate is in the unfolded configuration the bridging contact is in electrical connection with both of the first stationary contact and the second stationary contact.

6. The promotional product of claim 1, wherein one or more of the bridging contact, the first stationary contact, and the second stationary contact are printed.

7. The promotional product of claim 1, further comprising a regulating circuit engaged with the rear primary surface, the regulating circuit being configured to regulate a flow of the electrical current to the emitter.

8. The promotional product of claim 1, further comprising a rear cover layer engaged with the rear primary surface.

9. The promotional product of claim 1, wherein the substrate comprises a paperboard substrate.

\* \* \* \* \*